United States Patent [19]

Sekine et al.

[11] Patent Number: 5,231,287
[45] Date of Patent: Jul. 27, 1993

[54] METHOD AND APPARATUS FOR OBTAINING TWO-DIMENSIONAL ENERGY IMAGE, USING CHARGED-PARTICLE BEAM

[75] Inventors: Tetsu Sekine; Yoshiyuki Ando; Shin Kaneko, all of Tokyo, Japan

[73] Assignee: Jeol Ltd., Tokyo, Japan

[21] Appl. No.: 838,147

[22] Filed: Feb. 18, 1992

[30] Foreign Application Priority Data

Feb. 20, 1991 [JP] Japan ................................. 3-025000

[51] Int. Cl.$^5$ .............................................. H01J 37/26
[52] U.S. Cl. ..................................... 250/305; 250/310
[58] Field of Search ................. 250/305, 306, 307, 310

[56] References Cited

U.S. PATENT DOCUMENTS 3,631,238 12/1971 MacDonald ....................... 250/305
3,909,610 9/1975 Kokubo ............................. 250/305
4,034,220 7/1977 le Gressus et al. ................. 250/305
4,459,482 7/1984 Bales .................................. 250/305

OTHER PUBLICATIONS

N. C. MacDonald and J. R. Waldrop, *Applied Physics Letters*, vol. 19, No. 9, Nov. 1991, pp. 315–318.

Primary Examiner—Paul M. Dzierzynski
Assistant Examiner—Kiet T. Nguyen
Attorney, Agent, or Firm—Webb, Burden, Ziesenheim & Webb

[57] ABSTRACT

A scanning Auger spectrometer using a cylindrical mirror analyzer. This analyzer is set to a given value Eo. A deviation ΔE of the energy actually measured by the analyzer from the set value Eo occurs. The relation of the deviation ΔE to the coordinates of each analyzed point is measured. During the measurements, the set energy is shifted in response to the position hit by the electron beam according to information obtained from the measurements in such a way that the deviation does not take place.

4 Claims, 4 Drawing Sheets

METHOD AND APPARATUS FOR OBTAINING TWO-DIMENSIONAL ENERGY IMAGE, USING CHARGED-PARTICLE BEAM

FIELD OF THE INVENTION

The present invention relates to a method and an apparatus for obtaining a two-dimensional energy image, using a charged-particle beam and, more particularly, to a method and an apparatus for scanning a sample under investigation with an electron beam in two dimensions and displaying a two-dimensional image of the sample according to the output signal from an energy analyzer which is set to a given energy value and measures the energies of Auger electrons and other electron emanating from the sample in response to the scan.

BACKGROUND OF THE INVENTION

A cylindrical mirror analyzer (CMA) is known as an energy analyzer which is highly sensitive to electrons and ions. The structure of this analyzer is schematically shown in FIG. 6, where an inner cylinder having a radius of $R_1$ and an outer cylinder having a radius of $R_2$ are disposed coaxially. The outer cylinder is placed at a negative potential with respect to the inner cylinder. The inner cylinder is provided with slits near its both ends, the slits extending circumferentially. The slits have a width of W. Electrons or ions emerging from a point to be analyzed enter one slit and then pass between the inner and outer cylinders, the point being located close to the axis. Only electrons or ions having energy which are given by a linear function of the potential difference are allowed to pass through the other slit and is then converged onto the axis. Linear convergence occurs independent of the incident angle to the front slit. Where the incident angle is 42.3° and the distance Lo between the analyzed point and the converging point is $5.6038R_2$, quadratic convergence take place.

This cylindrical mirror analyzer can analyze only a narrow region. As the analyzed point moves, the output intensity or energy from the analyzer varies sensitively. The region $\phi_{ok}$ which can be analyzed without producing these problems is less than approximately 1% of the radius $R_1$ of the inner cylinder of the analyzer. The generally used cylindrical mirror analyzer can analyze only a quite small region having a diameter less than hundreds of microns.

For example, in Auger electron imaging, the surface of a sample is raster-scanned in two dimensions with a primary electron beam to measure the peak intensity P and the background intensity B. The intensity difference (P−B) is calculated. Also, the ratio (P−B)/B is computed. Thus, a two-dimensional image of the sample is displayed. It is customary to make measurements only at two predetermined points $E_{pk}$ and $E_{bkg}$, for saving the time required for the measurements. At the point $E_{pk}$, the peak intensity is measured. At the point $E_{bkg}$, the background intensity is measured. The prior art technique for presenting a two-dimensional Auger image in this manner is disclosed by N. C. MacDonald and J. R. Waldrop, in *Applied Physics Letters*, Volume 19, Number 9, November 1971.

However, if the primary electron beam is scanned outside the aforementioned analyzable region $\phi_{ok}$, the peak energy shifts considerably. Consequently, it is impossible to determine the peak intensity P and the background intensity B. Especially, where the sample surface is inclined, larger errors occur.

SUMMARY OF THE INVENTION

It is an object of the present invention to provide a method of correctly analyzing a wider sample surface area than heretofore without posing the foregoing problems with the prior art Auger electron spectroscopy using an energy analyzer, by correcting the measured peak energy shift according to the amount of the deviation from a reference point for analysis.

It is another object of the invention to provide an apparatus capable of carrying out the method described just above.

In accordance with the present invention, an energy analyzer is set to a given energy value Eo. A sample under investigation is scanned in two dimensions with a primary charged-particle beam. The resulting charged particles from the sample are directed to the energy analyzer. A two-dimensional image of the sample is created from the output signal from the analyzer. Let $\Delta E$ be the difference between the energy value actually measured by the analyzer and the set energy value Eo. This method is characterized in that the relation of the energy difference $\Delta E$ to the coordinates of each analyzed point is measured, and that the energy value to which the analyzer is set is shifted according to information obtained from the measurement and according to the position hit by the charged-particle beam during a sequence of measurements so as to prevent the above-described deviation.

Other objects and features of the invention will appear in the course of the description thereof which follows.

DETAILED DESCRIPTION OF THE INVENTION

Figure 1:
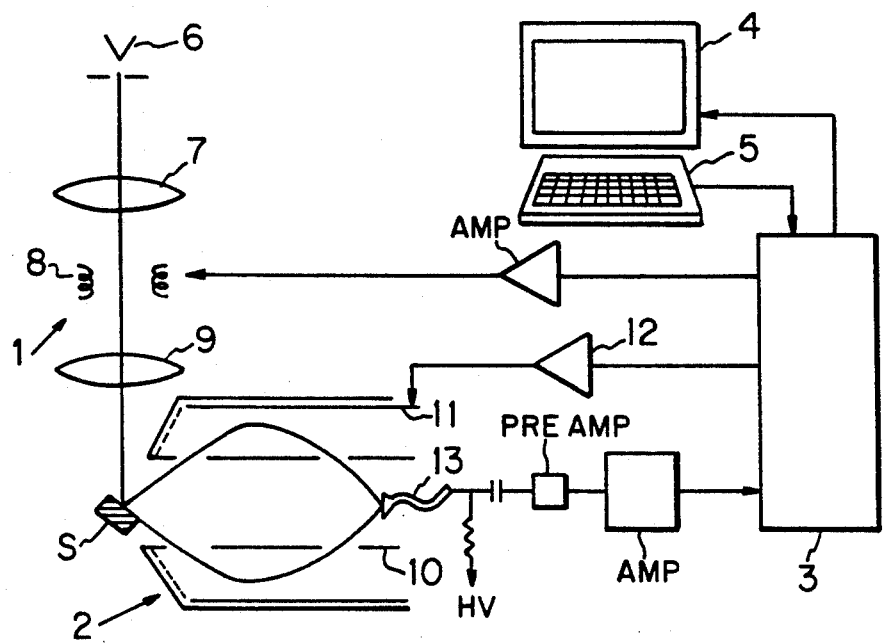
FIG. 1 is a schematic block diagram of a non-coaxial scanning Auger spectrometer according to the invention.

Referring to FIG. 1, there is shown a scanning Auger spectrometer according to the invention. This instrument includes a primary electron beam scanning system 1, a cylindrical mirror analyzer (CMA) 2, a computer 3 forming an image-processing system, a display unit 4, and an entry device 5 such as a keyboard. An electron gun 6 emits an electron beam, which is focused onto a sample S via a condenser lens 7, deflection coils 8, and an objective lens 9. The analyzer 2 is composed of an inner cylinder 10 and an outer cylinder 11. An amplifier 12 is connected between the outer cylinder 11 and the computer 3. The sample S is excited by the beam which is scanned and made to hit around the central point, or a reference point, on the sample S. Those Auger electrons emanating from the hit point to be analyzed which are related to the voltage applied to the outer cylinder 11 of the analyzer 2 are focused onto the incident surface of a detector 13 inside the analyzer 2. Thus, the intensity of the focused electrons is detected.

In order to obtain an Auger image representing a two-dimensional distribution of a given energy value with this instrument, the amplifier 12 is controlled in such a manner that the cylindrical mirror analyzer 2 is capable of detecting electrons having energy $E_{pk}$. Under this condition, the primary electron beam is scanned. At this time, the output signal from the detector 13 is stored in the memory of the computer 3 at an address corresponding to the position of the beam. Then, the instrument is so adjusted that electrons possessing energy $E_{bkg}$ can be detected. Under this condition, the same line is scanned, and the resulting electrons are detected again. From the obtained data, the intensity difference (P−B) is calculated. Also, the ratio (P−B)/B is computed. In this way, data about the intensities on one scanning line is collected. This series of operations is repeated for each of successive scanning lines. Finally, an Auger image representing the two-dimensional distribution of intensity is derived. Where the distance between the successive scanning lines is small, an accurate Auger image can be obtained by this method.

Figure 2:
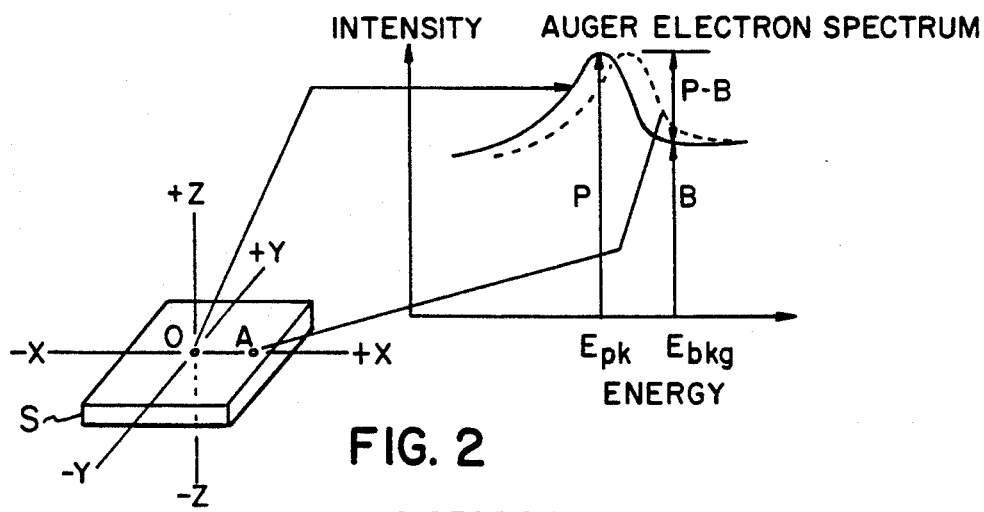
FIG. 2 is a graph in which the peak of spectrum obtained from the center of a material having a homogeneous composition analyzed by a cylindrical mirror analyzer and the peak obtained from a point remote from the center are plotted against energy.
Figure 3:
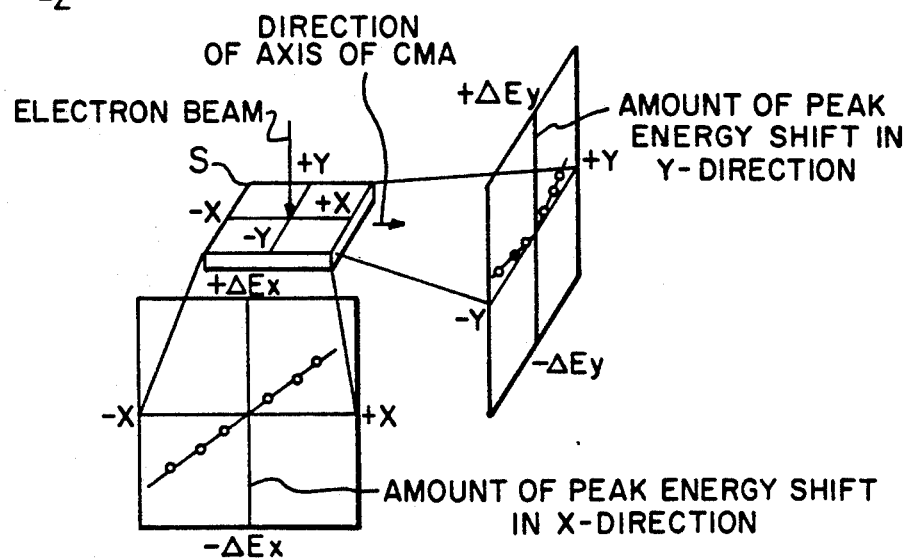
FIG. 3 is a diagram illustrating peak shifts obtained by the spectrometer shown in FIG. 1.

In FIG. 2, the solid line indicates the peak of a spectrum obtained from the center O of an analyzed region on a sample having a homogeneous composition by means of the cylindrical mirror analyzer (CMA) 2. The broken line indicates the peak of a spectrum obtained from a point A that is remote from the center O. If the point A deviates from the center O as shown, then those peaks which should coincide in position do not agree in position, i.e., an energy shift takes place. If the distance between these two points O and A is large, then the shift of the point A from the center O is so large that it can no longer be neglected. In the non-coaxial type instrument shown in FIG. 1, i.e., the axis of the cylindrical mirror analyzer is located off the axis of the electron gun, the behavior of the peak shift differs from direction to direction relative to the analyzer 2. As shown in FIG. 3, the direction of the axis of the cylindrical mirror analyzer on the sample surface is taken in the x-direction. The direction perpendicular to this x-direction and also to the primary electron beam on the sample surface is taken in the y-direction. The above-described peak shifts behave as pictured in this figure. In the x-direction, the energy value detected increases toward the analyzer and decreases away from the analyzer. In any direction the amount of the peak energy shift is in proportion to the distance from the center of the analyzed region as long as the shift in position is small.

Before a formula used for calculating such amount of peak energy shift is derived, we now summarize empirically discovered terms.

(1) The amount of peak energy shift is proportional to the displacement from the center, whether the shift occurs in the x-direction or in the y-direction.

(2) The amount of peak energy shift at an arbitrary point is the sum of the amount of peak energy shift caused by a displacement in the x-direction and the amount of peak energy shift caused by a displacement in the y-direction.

(3) When the sample is tilted, the amount of peak energy shift varies in a nonlinear relation to the angle of the tilt.

(4) The amount of peak energy shift is in proportion to the peak energy because of the nature of the cylindrical mirror analyzer.

Figure 4:
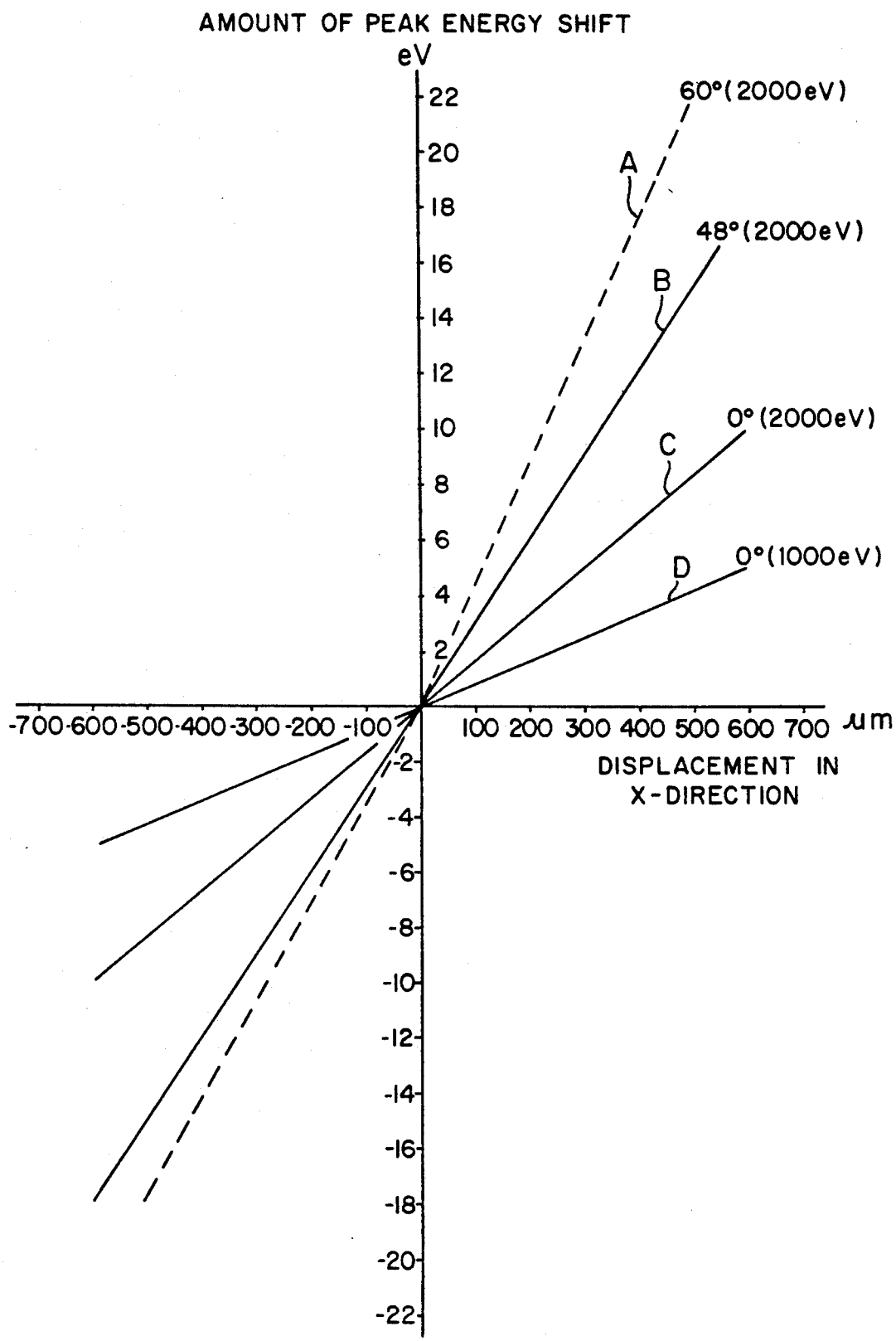
FIG. 4 is a graph in which measured values of peak energy shift are plotted against the displacement from the central point in the x-direction.

FIG. 4 shows actually measured amount of peak energy shift. Curve A indicates the relation obtained when the sample was inclined at 60° to the horizontal containing the central axis of the cylindrical mirror analyzer and the measured peak energy was 2000 eV. Line B indicates the relation obtained when the sample was inclined at 48° to the horizontal and the measured peak energy was 2000 eV. Line C indicates the relation obtained when the sample was inclined at 0°, i.e., placed horizontal, and the measured peak energy was 2000 eV. Line D indicates the relation obtained when the sample was inclined at 0° and the measured peak energy was 1000 eV. The terms (1), (3), and (4) described above have been confirmed from these data. The term (2) has also been confirmed empirically.

Based on these conditions, we now calculate the amount of peak energy shift when the sample is inclined at an arbitrary angle $\theta$ from the x-direction. As described previously, the cylindrical mirror analyzer is so set up that the electron beam emerging in a direction inclined upwardly at about 42° from the central axis, or the horizontal, within a cross section containing the central axis is detected. Therefore, the plane which is inclined at 48° from the central axis is perpendicular to the direction of detection. This inclined plane can be easily treated as a reference plane for inclinations less steep than 48° and for inclinations steeper than 48°. In practice, signals other than the signal produced within this cross section are generated. Nonetheless, almost all the physics can be elucidated from this relation within the cross section, since the signals produced around this cross section are relatively large.

Figure 5:
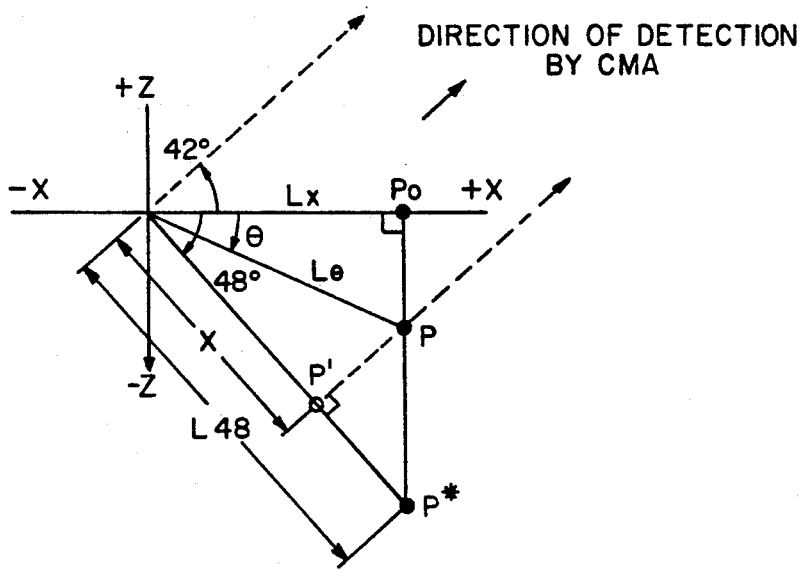
FIG. 5 is a diagram illustrating the principle on which a formula used for angle correction is derived.
Figure 6:
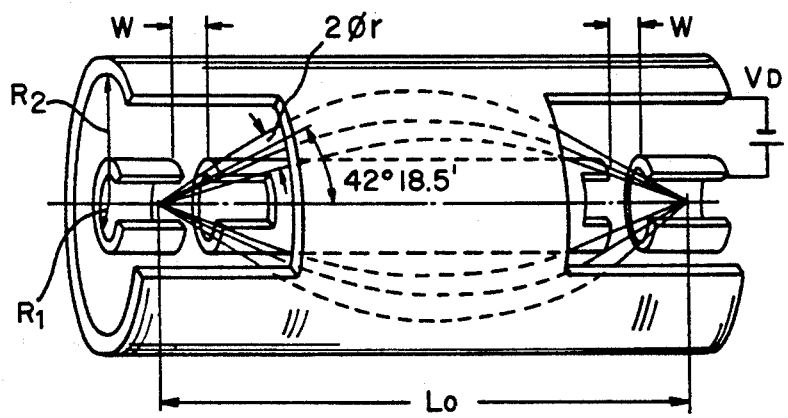
FIG. 6 is a partially cutaway side elevation of the prior art cylindrical mirror analyzer.

The following description is based on these premises. We now refer to the diagram of FIG. 5 illustrating the manner in which the formula used for angle correction is derived. When the angle is inclined at 48° ($\theta$=48°), if the amount of energy shift corresponding to a horizontal displacement Lx of the analyzed point caused by a displacement of the electron beam in the x-direction is known, and if the projection of the displacement Lx onto the x-axis is $L_{48}$, then the amount of energy shift corresponding to the horizontal displacement Lx (the projection of which onto the inclined surface is $L\theta$) when the sample is inclined at an arbitrary angle $\theta$ is found in the manner described below.

Where the horizontal displacement Lx is not very large, the amount of the energy shift $\Delta Ex$ is in proportion to the displacement Lx. Thus, $$\Delta EX(48°) = k_x L_x$$

The proportional constant $k_x$ in the above formula is found from the gradient of the straight line B in FIG. 4.

Where the sample is inclined at angle $\theta$, electrons emitted from a point P lying on this inclined surface in the direction of detection made by the cylindrical mirror analyzer follow the same spectral trajectory as the electrons which are emitted in the sample direction from the point P ' projected onto the 48°-inclined surface. Therefore, both kinds of electrons are identical in energy shift. That is, the point P' is the projection of the point P onto the surface inclined at 48°. From FIG. 5 it can be seen that the following relations hold:

$$L\theta/Lx = 1/\cos\theta$$

$$Lx/L_{48} = \cos 48°$$

$$X/L\theta = \cos(48° - \theta)$$

The ratio $\gamma$ of X to $L_{48}$ is given by $$\gamma = X/L_{48} = \cos 48° \cdot \cos(48° - \theta)/\cos\theta$$

Using the ratio $\gamma$, the amount of energy shift $\Delta Ex$ caused when the surface is inclined at an arbitrary angle $\theta$ is given by $$\Delta Ex = \gamma kx\, Lx \tag{1}$$

Let $E_{pk}$ be the measured peak energy value. When the measured position has shifted Lx in the x-direction, the voltage applied to the outer cylinder of the cylindrical mirror analyzer must correspond to $(E_{pk} - \gamma kx\, Lx)$ rather than to $E_{pk}$. Situations in which other factors are taken into account will be described later.

Also with respect to displacement in the y-direction perpendicular to the central axis of the cylindrical mirror analyzer and also to the primary io electron beam, when the displacement Ly of the analyzed point is very small, the amount of enerqy shift is in proportion to the displacement Ly. Since the proportional constant for a displacement in the y-direction is different from the proportional constant for the same displacement in the direction opposite to the y-direction, they are expressed by k+y and k-y, respectively. The amount of peak energy shift is given by $$\Delta Ey = k+yL-y \text{(in the y-direction)}$$

$$\Delta Ey = K-yLy \text{ (in the direction opposite to the y-direction)} \tag{2}$$

From item (2) described above, the amount of energy shift $\Delta E$ at an arbitrary position on the sample surface is expressed by the sum of the amounts of shifts in the x- and y-directions, the amounts being respectively found from equations (1) and (2) above. That is, the amount of shift can be approximated as follows:

$$\Delta E = \Delta Ex + \Delta Ey \tag{3}$$

In practice, the relation $\Delta Ex >> \Delta Ey$ holds and so $\Delta Ey$ is normally negligible. However, where an accurate measurement is made, $\Delta Ey$ cannot be neglected. Therefore, it is necessary to find the proportional constants k+y and k-y and then to make corrections according to the equations (1)-(3).

Because of the property of the cylindrical mirror analyzer, the amount of shift varies in proportion to the measured peak energy, i.e., the voltage applied to the outer cylinder, if the positional displacement remains the same, as already mentioned in item (4). Let $E_R$ be the reference energy, in this case 2000 eV. If the amount of energy shift at this energy is found from equation (3), then the amount of energy shift at an arbitrary energy E is given by $$\Delta E = (E/E_R)(\Delta Ex + \Delta Ey) \tag{4}$$

where E is the measured peak energy. If the measured position is displaced Lx in the x-direction and Ly in the y-direction, then the voltage impressed on the outer cylinder of the analyzer must be so adjusted as to correspond to $(E - \Delta E)$ rather than to E.

The correction method described above is intended to prevent the peak energy shift from reducing the output signal from the detector that detects Auger electrons. If the displacement from the central point increases further, the output signal from the detector decreases due to the peak energy shift. In addition, the efficiency of the analyzer drops, thus contributing to a reduction in the intensity of the peak energy itself. In this case, accurate Auger images representing a wider region can be obtained by previously measuring the rate at which the peak intensity decreases through the use of a reference sample and then correcting the measured peak energy intensity according to the measured rate.

Figure 7:
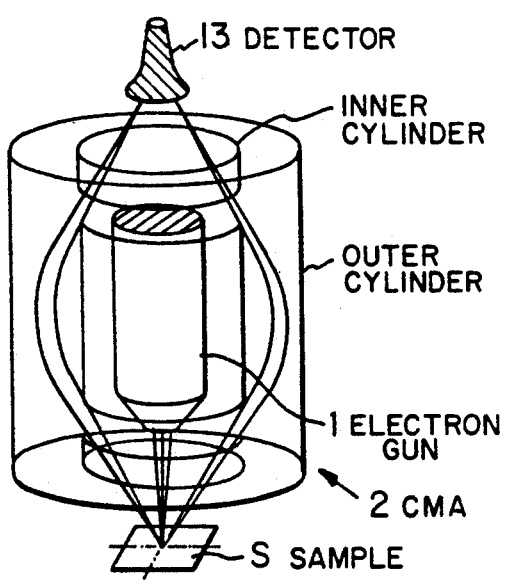
FIG. 7 is a schematic perspective view of a coaxial Auger spectrometer.
Figure 8:
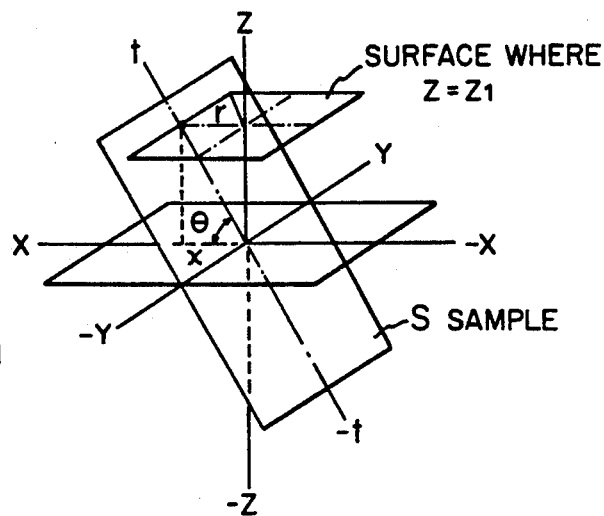
FIG. 8 is a diagram illustrating the coordinates of a sample analyzed by the spectrometer shown in FIG. 7.

We have thus far described the manner in which a formula for calculating the amount of peak energy shift is derived when a non-coaxial Auger spectrometer as shown in FIG. 1 is used. A coaxial Auger spectrometer in which an electron gun and a cylindrical mirror analyzer are mounted coaxially is schematically shown in FIG. 7. The same theory can be applied also to this coaxial type to derive an equation concerning the amount of peak energy shift. Referring to the coordinate system of FIG. 8, it is assumed that the central axis of the cylindrical mirror analyzer 2 is located on the z-axis. With respect to a displacement from the reference point on the sample 5 surface inclined at angle $\theta$ from the x-axis, the z-axis component is given by $$z = x \tan\theta$$

The distance from the central axis is given by $$r = \sqrt{x^2 + y^2}$$

The amount of energy shift in the r-direction can be approximated by $$\Delta E_r = a_o + a_1 r + a_2 r^2$$

The amount of energy shift in the z-direction can be approximately by $$\Delta E_z = b_o + b_1 r + b_2 r^2$$

In the above equations, $a_o$, $a_1$, $a_2$, $b_o$, $b_1$, and $b_2$ are correction coefficients. In conformity with equation (4) above, the amount of energy shift is given by $$\Delta E = (E/E_R)(\Delta E_r + \Delta E_z) \tag{5}$$

One example of a sequence of operations for obtaining an Auger image, using the novel correction method is given below.

[1] Measurement of data about peaks:
(1) The electron beam is brought to the starting position of the scanning line.

(2) The spectral energy analyzed by the cylindrical mirror analyzer is set to $E_{pk}+\Delta E_{x1}$, where $\Delta E_{x1}$ is an amount of correction corresponding to the displacement of the starting position from the reference point. This amount of correction is found from equations (1)–(5).

(3) The intensity $P_1$ of Auger electrons obtained at this time is measured.

(4) The electron beam is moved to the next position on the scanning line.

(5) The spectral energy analyzed by the cylindrical mirror analyzer is set to $E_{pk}+\Delta E_{x2}$, where $\Delta E_{x2}$ is an amount of correction for the new position.

(6) The intensity $P_2$ of Auger electrons obtained at this time is measured.

(7) The steps (1)–(6) are repeated up to the end of the scanning line.

[2] Measurement of data about the background (1) The electrons beam is brought to the starting position of the scanning line assumed in measurement [1].

(2) The spectral energy analyzed by the cylindrical mirror analyzer is set to $E_{bkg}+\Delta E_{x1}'$, where $\Delta E_{x1}'$ is an amount of correction corresponding to the displacement of the starting position from the reference point. This amount of correction is found from equations (1)–(5).

(3) The intensity $B_1$ of Auger electrons obtained at this time is measured.

(4) The electron beam is moved to the next position on the scanning line.

(5) The spectral energy analyzed by the cylindrical mirror analyzer is set to $E_{bkg}+\Delta E_{x2}'$, where $\Delta E_{x2}'$ is an amount of correction for the new position.

(6) The intensity $B_2$ of Auger electrons obtained at this time is measured.

(7) The steps (1)–(6) are repeated up to the end of the scanning line.

[3] Calculations of $P_1-B_1$, $(P_1-B_1)/B_1$, and so forth are repeated for each point up to the end of the scanning line.

[4] The sequences [1]–[3] are carried out for every scanning line. In this way, an Auger image representing a two-dimensional distribution of intensity is obtained.

Thus, the spectral energy to which the energy analyzer is set is corrected for every analyzed point. Therefore, if the analyzed point deviates from the reference point during the scan of the electron beam, it is unlikely that the actually measured peak energy value shifts from the value to be measured. Consequently, the peak value can be tracked at all times. Hence, the analyzable region of the sample is not limited to a narrow area. The region from which an accurate Auger image can be derived can be extended. In practice we have successfully extended the conventional analyzable region having a diameter of about 300 μm to about 1000–1500 μm.

Embodiments of the novel method of correcting the peak energy shift in Auger electron imaging have been described. It is to be understood that the present invention is not limited to these embodiments and that various changes and modifications are possible.

Figure 9:
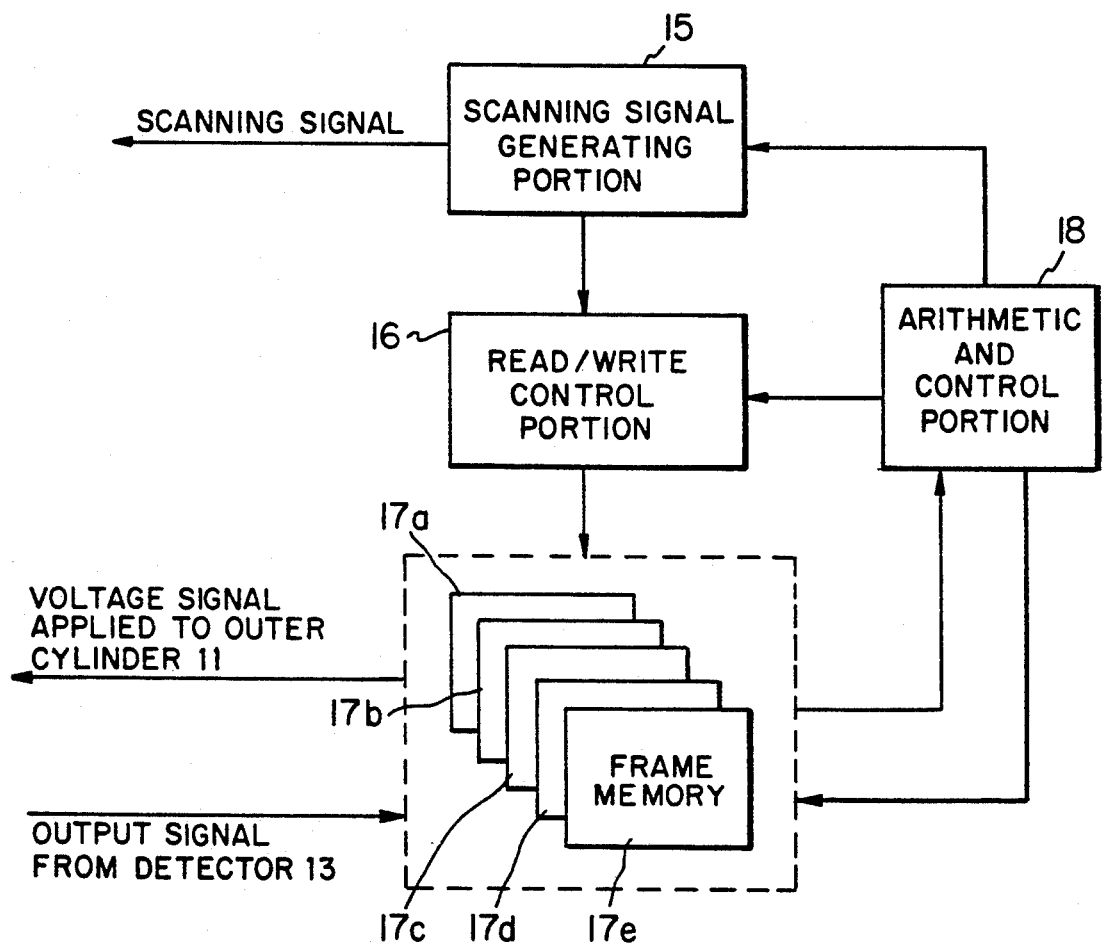
FIG. 9 is a block diagram of main portions of another Auger spectrometer according to the invention.

Referring next to FIG. 9, there is shown a further Auger spectrometer according to the invention. The computer included in this instrument is particularly shown. The instrument is equipped with a scanning signal-generating portion 15 to scan a sample S in two dimensions with an electron beam. The scanning signal-generating portion 15 produces a signal to a Read/-Write control portion 16, which controls writing and reading of data to and from frame memories 17a, 17b, 17c, 17d, and 17e. The instrument is also equipped with an arithmetic and control unit 18 which controls the whole apparatus and performs arithmetic operations described later. In order to obtain a two-dimensional image without energy error from the results of measurement of Auger electrons having an energy of $E_{pk}$, voltage signals must be applied to the above-described outer cylinder 11. Let E (x, y) be this voltage corresponding to the coordinates (x, y) of each analyzed point. Let $\Delta E(x, y)$ be the necessary amount of energy shift at the coordinates of each analyzed point (x, y). The energy $E_{pk}(x, y)$ is given by $$E_{pk}(x, y)\ E_{pk}+\Delta E(x, y)$$

Data indicating this energy $E_{pk}(x, y)$ is stored in the frame memory 17a at an address corresponding to each analyzed point (x, y). Similarly, in order to measure the energy $E_{bkg}$ without energy error at each analyzed point, a voltage signal must be applied to the outer cylinder 11. Let $E_{bkg}(x, y)$ be this energy. Data indicating this energy $E_{bkg}$ is stored in the frame memory 17b at an address corresponding to each analyzed point. In the embodiment described first, the energies $E_{pk}(x, y)$ and $E_{bkg}(x, y)$ are calculated by finding the energy shift coefficient about the displacement of the analyzed point in the direction of the central axis of the energy analyzer as well as the energy shift coefficient about the displacement of the analyzed point in the orthogonal direction. In this embodiment, the peak energy value is found at each analyzed point on the reference sample. Then, each value of the energy $E_{pk}(x, y)$ is directly found and stored in the frame memory 17a. In the process of calculation of the values of the energy $E_{pk}(x, y)$, values of the amount of energy shift $\Delta E(x, y)$ are derived. Using these values, signals indicating the values of the energy $E_{bkg}$ are produced according to the results of the following calculation:

$$E_{bkg}(x, y)=E_{pk}+\alpha\Delta E(x, y)$$

where $\alpha$ is a proportional constant.

In this structure, an electron beam is directed to each analyzed point according to the output signal from the scanning signal-generating portion 15. In synchronism with this irradiation, data is read from the frame memory 17a. The voltage applied to the outer cylinder 11 is controlled according to the data read out in this way. During measurement of each analyzed point (x, y), the output signal from the detector 13 is sent via the Read/-Write control portion 16 to the frame memory 17c, where the data is stored at addresses corresponding to the analyzed points (x, y).

Then, the second series of two-dimensional scans is made on the sample S. A signal for setting the voltage applied to the outer cylinder 11 is supplied from the frame memory 17b to the cylindrical memory analyzer in synchronism with these scans. The output signal from the detector 13 is sent to the frame memory 17d, where the data is stored at addresses corresponding to the analyzed points (x, y). When this second series of scans is completed, the arithmetic and control unit 18 reads out data stored in the memories 17c and 17d at the corresponding addresses. Then, calculations of $P_1-B_1$, $(P_1-B_1)/B_1$, and so forth are performed for every analyzed point. The results of the calculations are stored in the frame memory $17_e$ at addresses corresponding to the analyzed points (x, y). Subsequently, the arithmetic and control unit 18 reads data from the frame memory $17_e$ and sends the data to a display unit (not shown), where a two-dimensional image of the sample is displayed.

The present invention can also be applied to cases where electron or ion images other than Auger images are spectrally analyzed by the use of a cylindrical mirror analyzer and measured. Furthermore, the invention is applicable to cases where an analysis is made, using an energy analyzer other than a cylindrical mirror analyzer such as a hemispherical energy analyzer.

As described thus far, the present invention can automatically compensate for the deviation of the energy value actually measured by an energy analyzer from the correct value, the deviation being caused by shift of each analyzed point from the reference point. In consequence, two-dimensional images can be obtained from wide ranges, based on accurate measurements of energies.

Having thus described the invention with the detail and particularity required by the Patent Laws, what is claimed and desired to be protected by Letters Patent is set forth in the following claims.

What is claimed is:

1. A method of obtaining a two-dimensional energy image, using a charged-particle beam, comprising the steps of:
    (a) setting the energy measured by an energy analyzer to a given value Eo;
    (b) scanning a sample under investigation with a primary charged-particle beam in two dimensions so that charged particles produced from the sample may be analyzed by the energy analyzer;
    (c) measuring the relation of the deviation $\Delta E$ of the energy actually measured by the analyzer from the given value Eo to the coordinates of each analyzed point;
    (d) scanning the sample under investigation with a primary charged-particle beam in two dimensions so that charged particles produced from the sample may be analyzed by the energy analyzer, said step (d) being carried out while shifting the set energy in response to the position hit by the charged-particle beam according to information obtained by the measurement of said step (c) in such a way that said deviation is not produced during said step (d); and
    (e) displaying a two-dimensional image of the sample in response to the output signal from the analyzer obtained by said step (d).

2. A method of obtaining a two-dimensional energy image, using a charged-particle beam as set forth in claim 1, wherein said energy analyzer is a cylindrical mirror analyzer.

3. A method of obtaining a two-dimensional energy image, using a charged-particle beam as set forth in claim 2, wherein said step of measuring the relation of the deviation $\Delta E$ to the coordinates of each analyzed point consists in finding an energy shift coefficient for a displacement of each analyzed point in the direction of the central axis of the analyzer and an energy shift coefficient for a displacement of each analyzed point in a direction perpendicular to the direction of the central axis of the analyzer.

4. An apparatus for obtaining a two-dimensional energy image of a given energy value Eo, using a charged-particle beam, said apparatus comprising:
    a means for scanning a sample under investigation with a primary charged-particle beam in two dimensions so that charged particles may be produced from the sample;
    an energy analyzer for analyzing the energies of the charged particles;
    a means for shifting the set energy of the energy analyzer in response to the position hit by the charged-particle beam during the scan to compensate for the deviation of the energy actually measured by the analyzer from the energy value Eo; and
    a means for displaying a two-dimensional image of the sample in response to the output signal from the analyzer.

* * * * *